(12) United States Patent
Winters

(10) Patent No.: US 7,180,238 B2
(45) Date of Patent: Feb. 20, 2007

(54) OLED MICROCAVITY SUBPIXELS AND COLOR FILTER ELEMENTS

(75) Inventor: Dustin L. Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 154 days.

(21) Appl. No.: 10/820,592

(22) Filed: Apr. 8, 2004

(65) Prior Publication Data

US 2005/0225237 A1    Oct. 13, 2005

(51) Int. Cl.
*H01J 1/62* (2006.01)
(52) U.S. Cl. ........................ 313/506; 313/503
(58) Field of Classification Search .............. 313/506, 313/503, 504
See application file for complete search history.

(56) References Cited

U.S. PATENT DOCUMENTS

| | | | |
|---|---|---|---|
| 4,356,429 A | 10/1982 | Tang | |
| 5,276,380 A | 1/1994 | Tang | |
| 5,405,710 A | 4/1995 | Dodabalapur et al. | |
| 5,478,658 A | 12/1995 | Dodabalapur et al. | |
| 5,550,066 A | 8/1996 | Tang et al. | |
| 5,554,911 A | 9/1996 | Nakayama et al. | |
| 5,780,174 A | 7/1998 | Tokito et al. | |
| 6,133,692 A | 10/2000 | Xu et al. | |
| 6,281,634 B1 | 8/2001 | Yokoyama | |
| 6,303,943 B1* | 10/2001 | Yu et al. | 257/40 |
| 6,392,340 B2 | 5/2002 | Yoneda et al. | |
| 6,456,013 B1 | 9/2002 | Komiya et al. | |
| 2002/0186214 A1 | 12/2002 | Siwinski | |
| 2002/0190639 A1 | 12/2002 | Yamada et al. | |
| 2003/0034938 A1 | 2/2003 | Yamada | |
| 2003/0107314 A1 | 6/2003 | Urabe et al. | |
| 2003/0213967 A1* | 11/2003 | Forrest et al. | 257/96 |
| 2005/0225232 A1* | 10/2005 | Boroson et al. | 313/504 |

* cited by examiner

*Primary Examiner*—Joseph Williams
*Assistant Examiner*—Bumsuk Won
(74) *Attorney, Agent, or Firm*—Raymond L. Owens

(57) ABSTRACT

An OLED device includes at least one light emitting layer arranged to produce light in a predetermined emitting area, a reflector and a semi-transparent reflector forming a microcavity structure for resonating the light produced in the at least one light emitting layer, and a color filter element disposed relative to a first portion of the predetermined emitting area so as to filter the light produced by the at least one light emitting layer and transmit substantially unfiltered light through a second portion of the predetermined emitting area.

7 Claims, 7 Drawing Sheets

OLED MICROCAVITY SUBPIXELS AND COLOR FILTER ELEMENTS

CROSS REFERENCE TO RELATED APPLICATIONS

Reference is made to commonly assigned U.S. patent application Ser. No. 10/762,675 filed Jan. 22, 2004 by Dustin L. Winters, et al., entitled "Green Light-Emitting Microcavity OLED Device Using a Yellow Color Filter Element"; commonly assigned U.S. patent application Ser. No. 10/680,758 filed Oct. 7, 2003 by Yuan-Sheng Tyan, et al., entitled "White-Emitting Microcavity OLED Device"; commonly assigned U.S. patent application Ser. No. 10/346,424 filed Jan. 17, 2003 by Yuan-Sheng Tyan, et al., entitled "Microcavity OLED Devices"; commonly assigned U.S. patent application Ser. No. 10/356,271 filed Jan. 31, 2003 by Yuan-Sheng Tyan, et al., entitled "Color OLED Display With Improved Emission"; commonly assigned U.S. patent application Ser. No. 10/368,513 filed Feb. 18, 2003 by Yuan-Sheng Tyan, et al., entitled "Tuned Microcavity Color OLED Display"; and commonly assigned U.S. patent application Ser. No. 10/643,837 filed Aug. 19, 2003 by Dustin L. Winters, et al., entitled "OLED Device Having Microcavity Gamut Subpixels and a Within Gamut Subpixel"; the disclosures of which are herein incorporated by reference.

FIELD OF INVENTION

This invention relates to microcavity organic electroluminescent (EL) devices.

BACKGROUND OF THE INVENTION

Full color organic electroluminescent (EL), also known as organic light-emitting devices or OLED, have recently been demonstrated as a new type of flat panel display. In simplest form, an organic EL device is comprised of an electrode serving as the anode for hole injection, an electrode serving as the cathode for electron injection, and an organic EL medium sandwiched between these electrodes to support charge recombination that yields emission of light. An example of an organic EL device is described in commonly assigned U.S. Pat. No. 4,356,429. In order to construct a pixilated display device such as is useful, for example, as a television, computer monitor, cell phone display, or digital camera display, individual organic EL elements can be arranged as an array of pixels in a matrix pattern. To produce a multicolor display, the pixels are further arranged into subpixels, with each subpixel emitting a different color. This matrix of pixels can be electrically driven using either a simple passive matrix or an active matrix driving scheme. In a passive matrix, the organic EL layers are sandwiched between two sets of orthogonal electrodes arranged in rows and columns. An example of a passive matrix driven organic EL devices is disclosed in U.S. Pat. No. 5,276,380. In an active matrix configuration, each pixel is driven by multiple circuit elements such as transistors, capacitors, and signal lines. Examples of such active matrix organic EL devices are provided in U.S. Pat. Nos. 5,550,066, 6,281,634, and 6,456,013.

OLED displays can be made to have one or more colors. Full color OLED devices are also known in the art. Typical full color OLED devices are constructed of pixels having three subpixels that are red, green, and blue in color. Such an arrangement is known as an RGB design. An example of an RGB design is disclosed in U.S. Pat. No. 6,281,634. Full color organic electroluminescent (EL) devices have also recently been described that are constructed of pixels having four subpixels that are red, green, blue, and white in color. Such an arrangement is known as an RGBW design. An example of an RGBW device is disclosed in U.S. Patent Application Publication 2002/0186214 A1.

Several approaches to obtaining color displays are known in the art. For example, each differently colored subpixel can be constructed using one or more different OLED materials. These materials are selectively placed on the subpixels with methods including shadowmasks, thermal transfer from a donor sheet, or ink jet printing. Another approach to producing a color display is to place OLED materials in a common stack of one or more layers across all the differently color subpixels and then use one or more different color filters to selectively convert the common OLED color to different colors for each subpixel. In this case the OLED materials are typically arranged so as to produce a broad emission spectrum, also referred to as white emission or white OLED. An example of a white OLED with color filters is disclosed in U.S. Pat. No. 6,392,340.

Yet another approach to achieving a color display is to place the OLED emission element within a microcavity structure to enhance emission at a specific wavelength as determined by the optical cavity length of the microcavity. Examples of such microcavity devices are shown in U.S. Pat. Nos. 5,405,710 and 5,554,911. In this case, a broad emitting OLED material can be used and, by varying the optical length of the cavity, different colored emission can be achieved. However, devices constructed with microcavities suffer from the problem that, when viewed at various angles, the color of the emission can change. This effect is described in U.S. Pat. No. 5,780,174. Therefore, a color OLED device using microcavity structures having reduced angular dependence on perceived color is desired.

SUMMARY OF THE INVENTION

It is therefore an object of the present invention to reduce apparent color shift at viewing angles off the normal for a microcavity device having a microcavity structure.

This object is achieved by an OLED device, comprising:

a) at least one light emitting layer arranged to produce light in a predetermined emitting area;

b) a reflector and a semi-transparent reflector forming a microcavity structure for resonating the light produced in the at least one light emitting layer; and c) a color filter element disposed relative to a first portion of the predetermined emitting area so as to filter the light produced by the at least one light emitting layer and transmit substantially unfiltered light through a second portion of the predetermined emitting area.

DETAILED DESCRIPTION OF THE INVENTION

Figure 1:
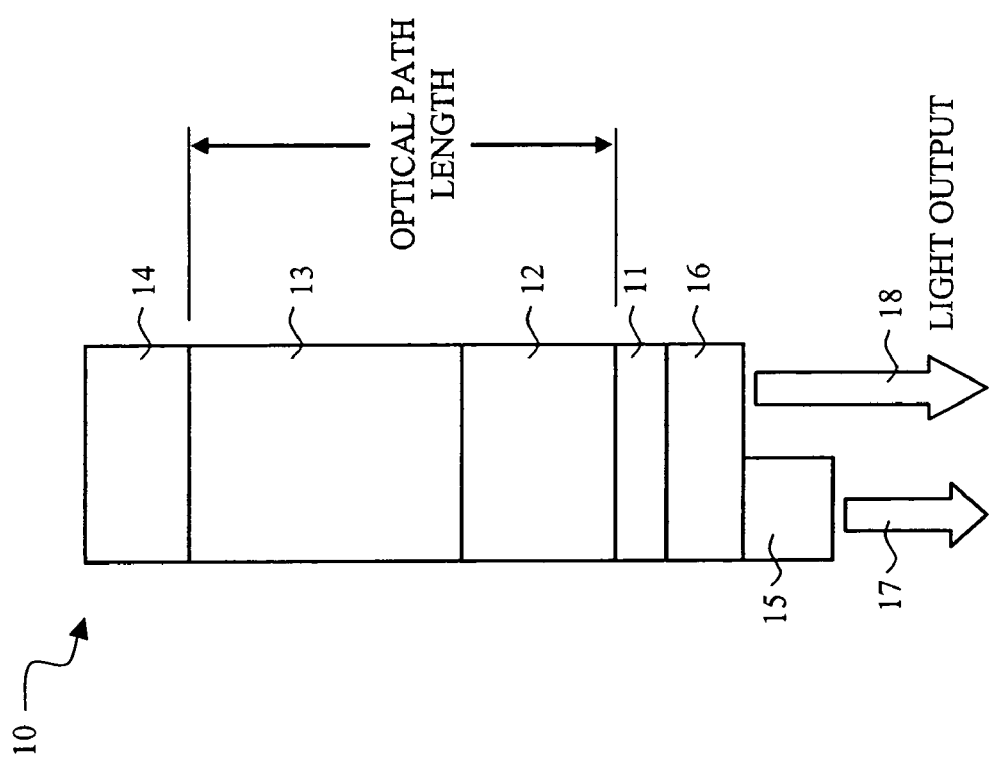
FIG. 1 depicts a cross-sectional view of a microcavity device according to the present invention.

FIG. 1 is an enlarged cross section of a simplified OLED microcavity device 10 according to the present invention. The OLED microcavity device 10 is constructed of a semi-transparent reflector 11, a cavity spacer 12, an organic EL medium 13, a reflector 14, a substrate 16, and a color filter element 15. In such a microcavity device, light is produced in the organic EL medium and resonates between the reflector 14 and the semi-transparent reflector 11, and exits the device through the semi-transparent reflector 11 toward the viewer. In this case, the semi-transparent reflector 11 could be constructed of a thin metal layer such as Ag or an alloy of Ag, which is preferably between 5 nm and 35 nm in thickness. The cavity spacer 12 is constructed of a transparent material such as ITO. In this example the cavity spacer layer also serves as the first electrode for the OLED device. While the cavity spacer layer is shown as a single layer, it can alternately be composed on several layers. The reflector 14 is preferably constructed of a highly reflective metal including, but not limited to, Al, Ag, Au, and alloys thereof. In this example, the reflector also serves as the second electrode for the OLED device.

The organic EL medium 13 is located between the first and second electrodes. In this case the cavity spacer 12 and the reflector 14 and can be chosen from many organic materials known in the art. The organic EL medium 13 is typically constructed of several sublayers such as a hole injecting layer, a hole transporting layer, a light emitting layer, and an electron-transporting layer. The organic EL medium can be constructed of small molecule organic materials, which are typically deposited by evaporation methods or by thermal transfer from a donor substrate. Alternately, the organic EL medium can be constructed of polymer materials, commonly referred to PLEDs, which can be deposited by methods such as ink jet printing or solvent spin or dip coating. The organic EL medium can be arranged as to produce a narrow bandwidth emission or a broad or white emission spectrum. Many possible configurations and materials can be chosen for the organic EL medium by one skilled in the art.

The substrate 16 is shown in FIG. 1 as being between the viewer and the organic EL medium 13, that is the semi-transparent reflector 11 is between the organic EL medium 13 and the viewer. This configuration where light travels through the substrate is known as a bottom emission device. In this configuration, a transparent substrate such as glass or plastic is used. Alternately, the device could be fabricated with the reflector between the substrate and the organic EL medium. This alternate configuration is known as a top emission device. In a top emission device, light does not pass through the substrate and the substrate can therefore be optionally opaque. This enables the use of a large variety of substrates. One example substrate that can be used with a top emission configuration is a silicon wafer. The substrate can further include active matrix circuitry (not shown) to drive the microcavity device.

Optical path length is defined as refractive index (n) multiplied by the thickness (d) for each layer. In a microcavity device, the total optical path length $(n_i d_i)$ of the layers between the reflector and the semi-transparent reflector is designed so as to approximately satisfy the following equation:

$$2\Sigma(n_i d_i)/\lambda + (Q_1+Q_2)/2\pi = m$$

wherein:

$n_i$ is the index of refraction and $d_i$ is the thickness of the ith layer;

$Q_1$ and $Q_2$ are the phase shifts in radians at the reflector 14 interface and the semi-transparent reflector 11, respectively;

$\lambda$ is the predetermined wavelength to be emitted from the device; and m is a non-negative integer.

Microcavity device 10 is an example microcavity device structure. Several variations are known in the art and can also be applied to the present invention. For example, the semi-transparent reflector could be constructed from a quarter wave stack of several alternating layers of transparent materials having different refractive indexes. The cavity spacer layer could alternately be placed between the reflector and the organic EL medium or it could be limited entirely. In either of these cases, the semitransparent reflector would then need to serve as an electrode for the organic EL medium.

The color filter element 15 is disposed outside of the microcavity structure on the side of the semi-transparent reflector 11 so as to be between the semi-transparent reflector and the viewer. In a multicolored pixilated display, it is preferable to locate the color filter element as close to the microcavity structure as possible to reduce pixel crosstalk. In a bottom emission device, the color filter element is therefore preferably located between the microcavity and substrate. However, the invention can also be made to work by placing the color filter element on the outside of the substrate. In top emission device, the color filter element is preferably located above the microcavity structure. However, the invention can also be made to work by locating the color filter element on either side of an attached second cover substrate (not shown). The color filter element is arranged so as to permit for some filtered light emission 17 and some unfiltered light emission 18. This is achieved by having the surface area of the filter overlapping the emitting area of the microcavity be less the total area of the emitting area.

The color filter element is selected so as to have a high transmittance at the wavelengths approximately corresponding to the desired color of the microcavity device and to have low transmittance at wavelengths of other colors of the visible light spectrum. The results of disposing the color filter element relative to the emitting area is that, as the device is viewed from angles off the normal, the typical color shift of a microcavity device is reduced in the filtered light emission 17. By designing the ratio of the surface area of the color filter element 15 relative to the total emitting area, the ratio filtered light emission 17 to unfiltered light emission 18 can be tuned, and the amount of color shift at non-normal viewing angles can be controlled. The amount of color shift of the device can be selected between the maximum value of a device with no color filter element and the minimum value of a device that has an emitting area which is completely covered by a color filter element. Since the color filter element absorbs a portion of the light produced by the microcavity, even at the desired color, the device will have lower brightness and is therefore less efficient than a device that has no color filter element. By designing the ratio of the surface area of the color filter element 15 relative to the total emitting area, the efficiency of the device can be selected between the maximum value of a device with no color filter element, and the minimum value of a device that has an emitting area which is completely covered by a color filter element. Therefore, by constructing a microcavity device according the present invention, the amount of color shift can be traded against the efficiency of the device.

Figure 2:
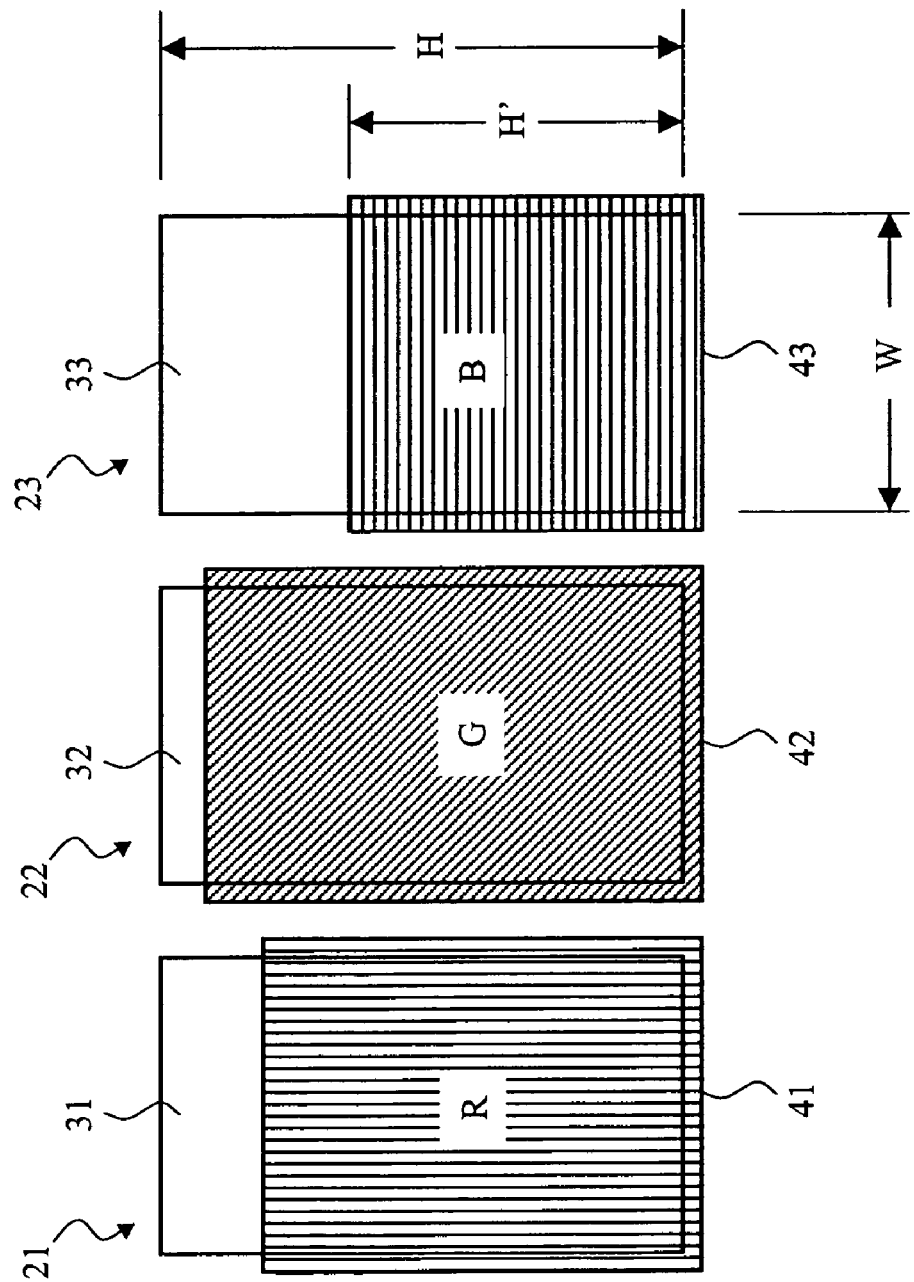
FIG. 2 depicts a top side view of a microcavity device pixel according to the present invention.

FIG. 2 illustrates a top side view of one pixel of a microcavity device according to an embodiment of the present invention having three subpixels: subpixel 21; subpixel 22; and subpixel 23. These subpixels could, for example, be made to produce red, green, and blue light. Emitting area 31, emitting area 32, and emitting area 33, define the portions of subpixel 21, subpixel 22, and subpixel 23, respectively, which emit light. The area, for example, of emitting area 33 is distance H multiplied by distance W. While in this example the emitting areas are shown to be rectangular, non-rectangular, and otherwise irregular shaped emitting areas are also envisioned as being within the scope of the present invention. Furthermore, while the three subpixels are shown as being the same size, pixels having subpixels with varying sizes are also envisioned as being within the scope of the present invention. Also, pixels having fewer or more than three subpixels are also envisioned as being within the scope of the present invention. Subpixel 23 further comprises color filter element 43. Color filter area is arranged so as to cover a portion of emitting area 33 in order to produce a filtered portion. This filtered portion area is, for example, H' multiplied by W. The remaining area of the emitting area that is not covered by the color filter element results in an unfiltered portion. While the filtered portion is shown as being rectangular, non-rectangular and otherwise irregular shaped filtered portions are also envisioned as being within the scope of the present invention. Likewise, subpixel 21 further comprises color filter element 41, and subpixel 22 further comprises color filter element 42. The percentage of the filtered portion area to the entire emitting area can differ for each different subpixel, as shown here, or can be made to be the same.

Figure 3E:
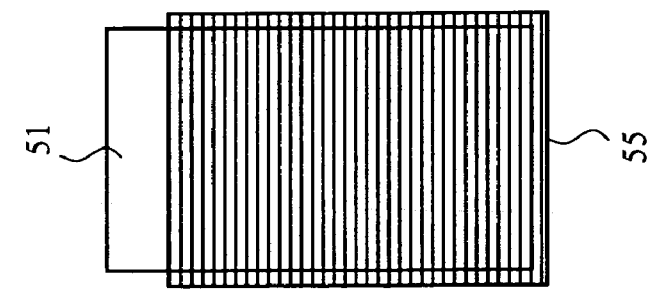
FIGS. 3A through 3E depict top side views of multiple embodiments of microcavity device subpixels according to the present invention.
Figure 3D:
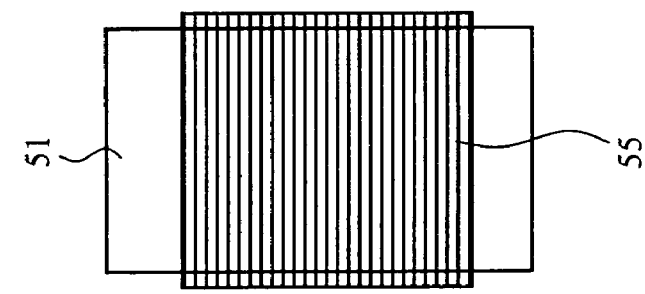
Figure 3C:
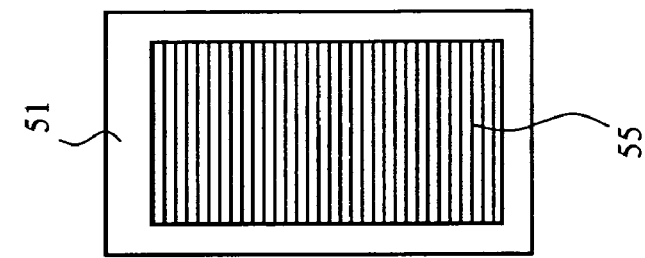
Figure 3B:
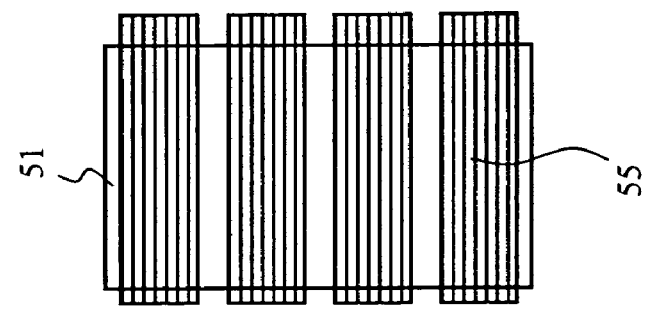
Figure 3A:
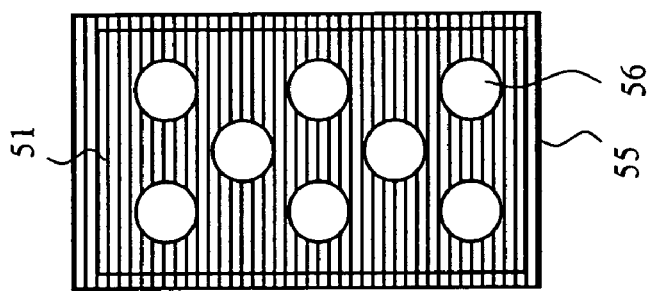

FIGS. 3A through 3E represent microcavity subpixels according the present invention having color filter elements with various shapes. FIG. 3A shows a subpixel having a color filter element 55 which covers an emitting area 51 such that an unfiltered portion is produced along one side of the emitting area and a filtered portion along the other side. FIG. 3B shows a subpixel where the color filter element 55 is arranged so as to form two unfiltered portions at either side of the emitting area 51. FIG. 3C shows a subpixel where the color filter element 55 is arranged so as to form a non-filtered portion along the perimeter of the emitting area while the center of the emitting area is filtered. FIG. 3D shows a subpixel where the color filter element 55 is arranged so as to form a plurality of filtered portions and a plurality of non-filtered portions. In this case the filtered portions form a striped pattern. FIG. 3E shows a subpixel where the color filter element 55 is arranged so have a plurality of filter openings 56 which permit unfiltered light emission to exit the device. FIGS. 3A through 3E show patterns that are regular and symmetric, however, an infinite number of other patterns that include regular and irregular and symmetric and asymmetric shapes are also possible and are envisioned as being within the scope of the present invention.

EXAMPLE

The present invention is explained more specifically with reference to the following example.

Three microcavity devices were prepared having a configuration as follows: a transparent glass substrate; a 20 nm Ag semi-transparent reflector; a 100 nm Al reflector; a plurality of organic layers with a refractive index of approximately 1.8; and no cavity spacer layer. In the first device, the total thickness of the organic layers was 296 nm. This thickness was selected so as produce a microcavity structure optimized to enhance emission in the red wavelengths. In the second device, the total thickness of the organic layers was 254 nm. This thickness was selected so as produce a microcavity structure optimized to enhance emission in the green wavelengths. In the third device, the total thickness of the organic layers was 219 nm. This thickness was selected so as produce a microcavity structure optimized to enhance emission in the blue wavelengths.

Figure 4A:
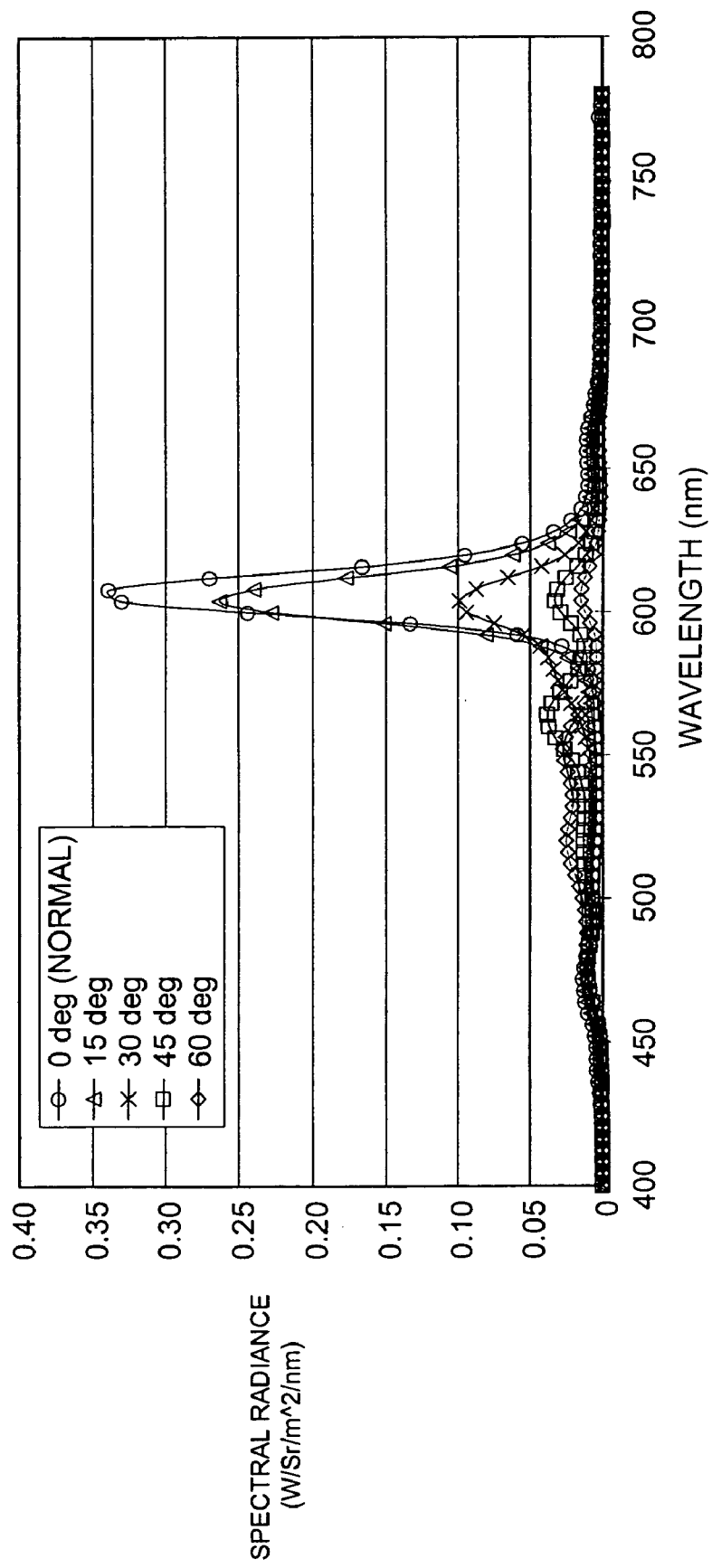
FIGS. 4A through 4C show the spectral emission of red emitting, green emitting, and blue emitting devices.
Figure 4B:
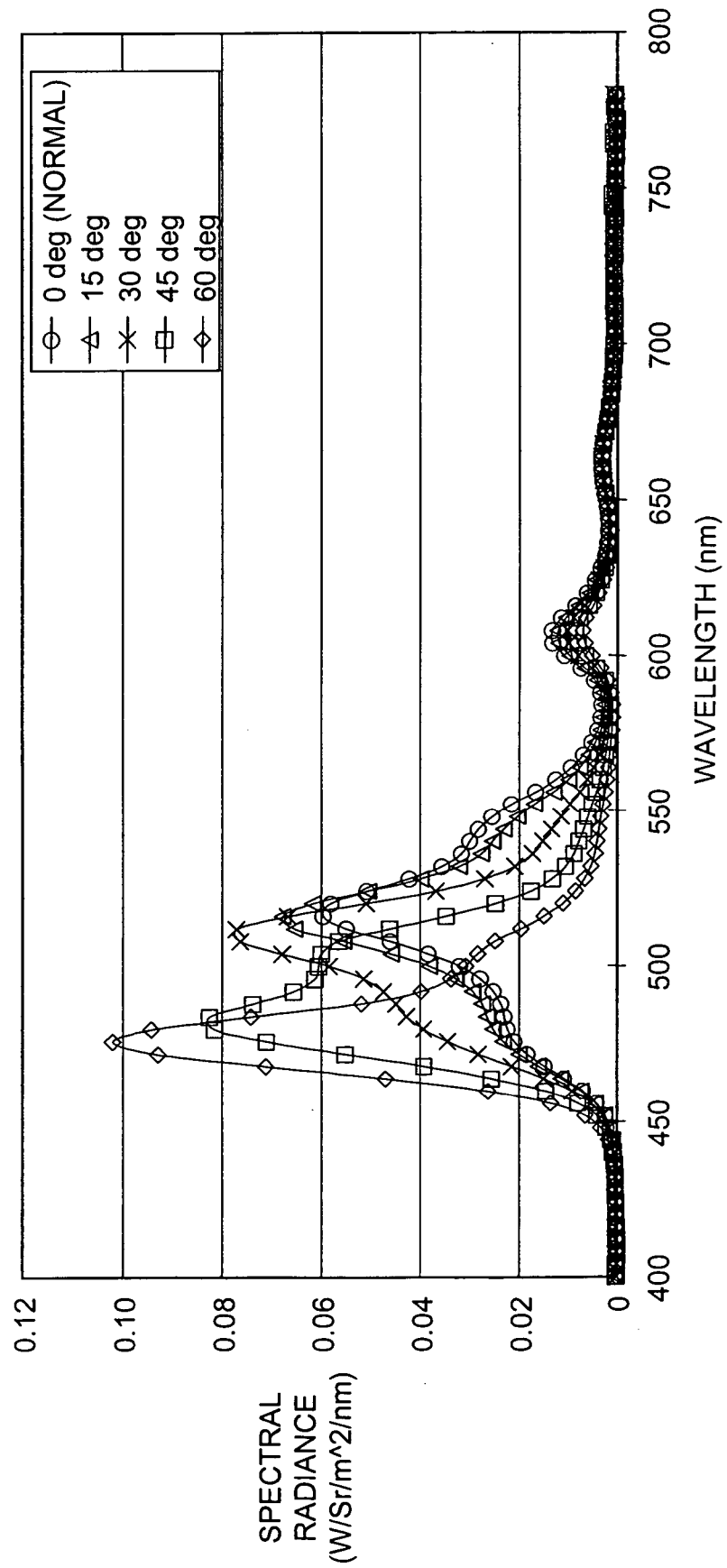
Figure 4C:
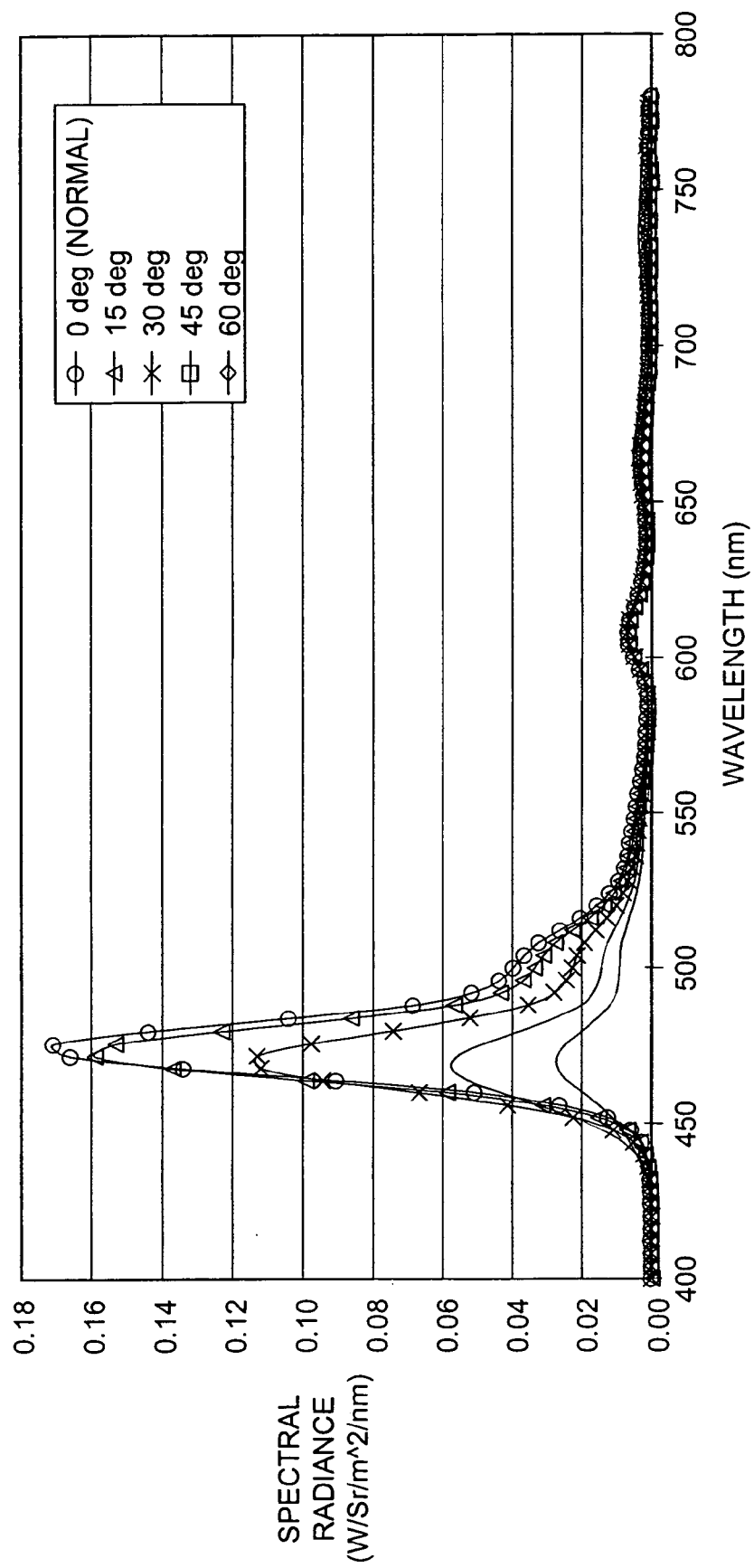

FIGS. 4A through 4C illustrate measurement of the unfiltered emission of the red, green, and blue microcavity devices by a Photo Research® PR®-650 Spectrascan® Colorimeter at several viewing angles.

FIG. 4A illustrates the unfiltered emission from the first microcavity which was constructed so as to have enhanced emission in the red color. It can be seen that as viewing angle changes from normal or 0 degrees to 60 degrees, the emission at red wavelengths decreases, while emission at yellow and green wavelengths increases.

FIG. 4B illustrates the unfiltered emission from the second microcavity which was constructed so as to have enhanced emission in the green color. It can be seen that as viewing angle changes from normal or 0 degrees to 60 degrees, the emission shifts from green wavelengths toward blue-green wavelengths.

FIG. 4C illustrates the unfiltered emission from the third microcavity which was constructed so as to have enhanced emission in the blue color. It can be seen that as viewing angle changes from normal or 0 degrees to 60 degrees, the emission shifts from blue wavelengths toward lower wavelengths peaks while the overall sharpness of the peak is reduced.

In these examples, the optical path length was varied by changing the total thickness of the organic EL media layers. In devices having a cavity spacer layer, the thickness of the cavity spacer can also be varied to achieve different optical path lengths of the cavity.

Figure 5:
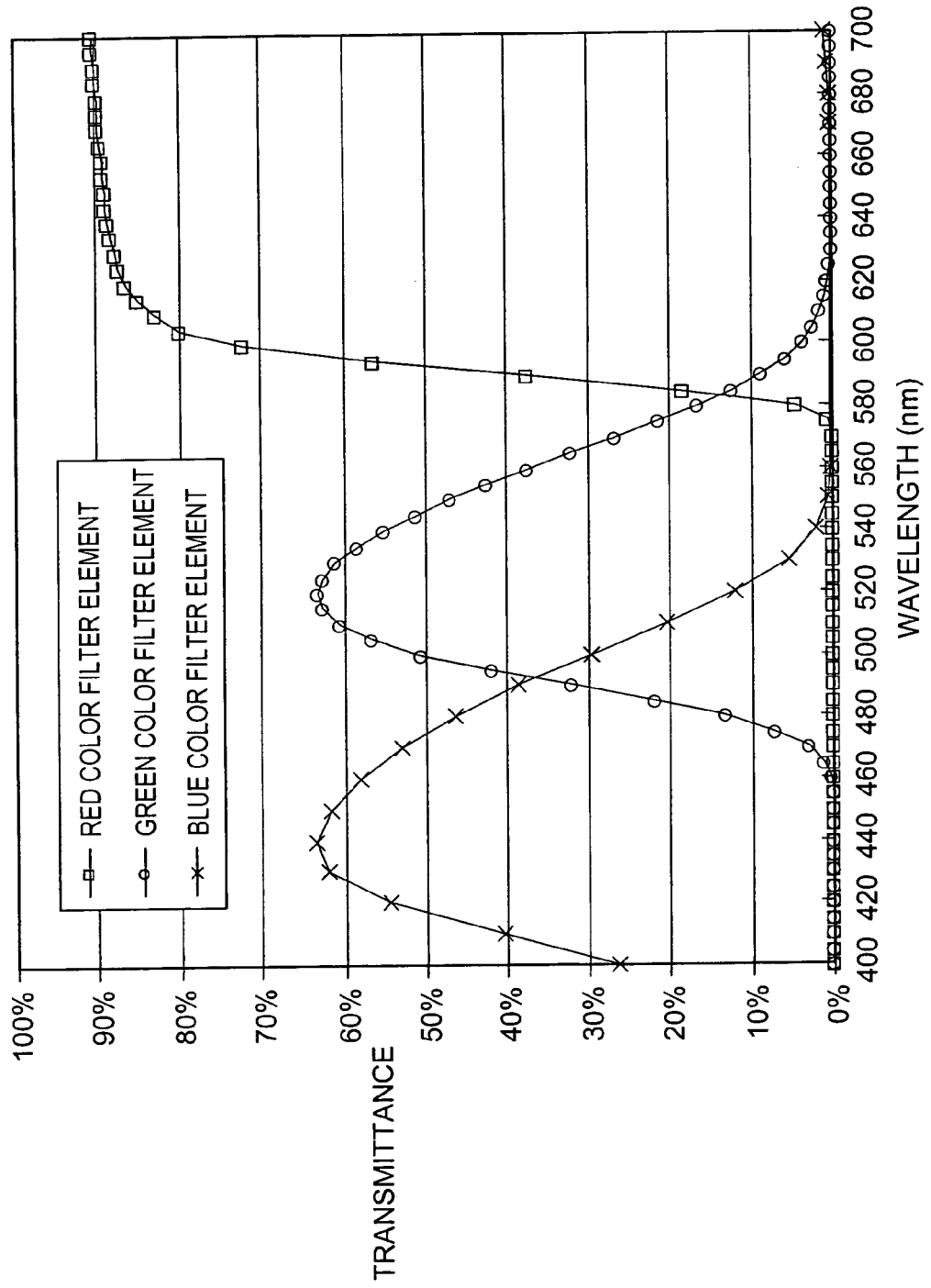
FIG. 5 shows the transmission properties of red, green, and blue color filter elements.

FIG. 5 shows the transmission properties of a red color filter element, green color filter element, and blue color filter element as a function of wavelength. These color filter elements are just one example of color filter elements, and many color filter elements are known in the art which can be employed in the present invention.

Table 1 shows the results of the simulated cascade at various viewing angles of red, green, and blue color filter elements from FIG. 5 with the first microcavity device which was red emitting, the second microcavity device which was green emitting, and the third microcavity device which was blue emitting, respectively. 1931 CIE x and y coordinates, luminance yield in terms of cd/A are shown. Normalized luminance relating the luminance yield at a given angle to the luminance yield at the normal 0 degree angle is also shown. Table 1 shows results for the case where the ratio of the color filter area to the emitting area is 100%, 90%, 80%, and 70%. Table 1 also shows the case where no color filters are applied is shown for comparison.

It can be seen from Table 1 that by applying the color filter elements, the chromaticity shift from viewing angles of 0 degrees to 60 degrees is reduced compared to the case where no filters are applied. However, luminance yield also is substantially reduced. In order to lessen the loss of luminance, the areas of the color filter elements relative to the emitting area can be reduced. Reducing the areas of the filter elements relative to the emitting areas results in increased chromaticity shift from viewing angles of 0 degrees to 60 degrees. However, substantial reduction in view angle dependence compared to the unfiltered case can be achieved without as much lost efficiency as the 100% filtered case.

TABLE 1

| Angle | CIEx | CIEy | Luminance Yield [cd/A] | Normalized Luminance [%] |
|---|---|---|---|---|
| Device 1-Red-No Filter | | | | |
| 0 | 0.599 | 0.347 | 14.87 | 100% |
| 15 | 0.584 | 0.359 | 13.11 | 88% |
| 30 | 0.523 | 0.399 | 8.60 | 58% |
| 45 | 0.412 | 0.479 | 6.87 | 46% |
| 60 | 0.311 | 0.529 | 5.47 | 37% |
| Device 1-Red-After 100% Red Filter Cascade | | | | |
| 0 | 0.654 | 0.346 | 9.99 | 100% |
| 15 | 0.648 | 0.351 | 8.03 | 80% |
| 30 | 0.643 | 0.356 | 3.47 | 35% |
| 45 | 0.649 | 0.351 | 1.21 | 12% |
| 60 | 0.655 | 0.345 | 0.56 | 6% |
| Device 1-Red-After 90% Red Filter Cascade | | | | |
| 0 | 0.646 | 0.346 | 10.47 | 100% |
| 15 | 0.639 | 0.353 | 8.54 | 82% |
| 30 | 0.620 | 0.365 | 3.99 | 38% |
| 45 | 0.574 | 0.391 | 1.78 | 17% |
| 60 | 0.512 | 0.421 | 1.05 | 10% |
| Device 1-Red-After 80% Red Filter Cascade | | | | |
| 0 | 0.639 | 0.346 | 10.96 | 100% |
| 15 | 0.630 | 0.354 | 9.05 | 83% |
| 30 | 0.600 | 0.372 | 4.50 | 41% |
| 45 | 0.528 | 0.416 | 2.34 | 21% |
| 60 | 0.444 | 0.458 | 1.54 | 14% |
| Device 1-Red-After 70% Red Filter Cascade | | | | |
| 0 | 0.632 | 0.346 | 11.45 | 100% |
| 15 | 0.622 | 0.355 | 9.55 | 83% |
| 30 | 0.585 | 0.377 | 5.01 | 44% |
| 45 | 0.970 | 0.433 | 2.91 | 25% |
| 60 | 0.403 | 0.479 | 2.03 | 18% |
| Device 2-Green-No Filter | | | | |
| 0 | 0.230 | 0.539 | 7.29 | 100% |
| 15 | 0.211 | 0.530 | 7.06 | 97% |
| 30 | 0.173 | 0.469 | 6.26 | 86% |
| 45 | 0.150 | 0.326 | 4.65 | 64% |
| 60 | 0.152 | 0.206 | 3.00 | 41% |
| Device 2-Green-After 100% Green Filter Cascade | | | | |
| 0 | 0.153 | 0.707 | 3.52 | 100% |
| 15 | 0.136 | 0.703 | 3.46 | 98% |
| 30 | 0.103 | 0.665 | 3.04 | 86% |
| 45 | 0.088 | 0.562 | 1.98 | 56% |
| 60 | 0.096 | 0.472 | 1.03 | 29% |
| Device 2-Green-After 90% Green Filter Cascade | | | | |
| 0 | 0.171 | 0.668 | 3.89 | 100% |
| 15 | 0.154 | 0.663 | 3.82 | 98% |
| 30 | 0.120 | 0.616 | 3.36 | 86% |
| 45 | 0.107 | 0.489 | 2.25 | 58% |
| 60 | 0.120 | 0.359 | 1.22 | 31% |
| Device 2-Green-After 80% Green Filter Cascade | | | | |
| 0 | 0.184 | 0.639 | 4.27 | 100% |
| 15 | 0.166 | 0.633 | 4.18 | 98% |
| 30 | 0.133 | 0.582 | 3.69 | 86% |
| 45 | 0.119 | 0.444 | 2.52 | 59% |
| 60 | 0.131 | 0.306 | 1.42 | 33% |
| Device 2-Green-After 70% Green Filter Cascade | | | | |
| 0 | 0.195 | 0.616 | 4.65 | 100% |
| 15 | 0.176 | 0.609 | 4.54 | 98% |
| 30 | 0.142 | 0.555 | 4.01 | 86% |
| 45 | 0.127 | 0.413 | 2.79 | 60% |
| 60 | 0.138 | 0.275 | 1.62 | 35% |

TABLE 1-continued

| Angle | CIEx | CIEy | Luminance Yield [cd/A] | Normalized Luminance [%] |
|---|---|---|---|---|
| Device 3-Blue-No Filter | | | | |
| 0 | 0.141 | 0.180 | 4.21 | 100% |
| 15 | 0.145 | 0.168 | 3.79 | 90% |
| 30 | 0.156 | 0.153 | 2.86 | 68% |
| 45 | 0.182 | 0.165 | 2.01 | 48% |
| 60 | 0.224 | 0.205 | 1.47 | 35% |
| Device 3-Blue-After 100% Blue Filter Cascade | | | | |
| 0 | 0.114 | 0.106 | 1.10 | 100% |
| 15 | 0.117 | 0.097 | 0.99 | 90% |
| 30 | 0.123 | 0.082 | 0.71 | 65% |
| 45 | 0.128 | 0.077 | 0.41 | 37% |
| 60 | 0.127 | 0.083 | 0.23 | 21% |
| Device 3-Blue-After 90% Blue Filter Cascade | | | | |
| 0 | 0.119 | 0.121 | 1.41 | 100% |
| 15 | 0.122 | 0.111 | 1.27 | 90% |
| 30 | 0.130 | 0.096 | 0.93 | 66% |
| 45 | 0.138 | 0.095 | 0.57 | 40% |
| 60 | 0.149 | 0.110 | 0.36 | 26% |
| Device 3-Blue-After 80% Blue Filter Cascade | | | | |
| 0 | 0.124 | 0.133 | 1.72 | 100% |
| 15 | 0.127 | 0.123 | 1.55 | 90% |
| 30 | 0.135 | 0.107 | 1.14 | 66% |
| 45 | 0.147 | 0.109 | 0.73 | 42% |
| 60 | 0.165 | 0.130 | 0.48 | 28% |
| Device 3-Blue-After 70% Blue Filter Cascade | | | | |
| 0 | 0.127 | 0.143 | 2.03 | 100% |
| 15 | 0.130 | 0.132 | 1.83 | 90% |
| 30 | 0.139 | 0.117 | 1.36 | 67% |
| 45 | 0.154 | 0.120 | 0.89 | 44% |
| 60 | 0.178 | 0.147 | 0.60 | 30% |

The invention has been described in detail with particular reference to certain embodiments thereof, but it will be understood that variations and modifications be effected within the spirit and scope of the invention.

PARTS LIST 10 microcavity device
11 semi-transparent reflector
12 cavity spacer
13 organic EL medium
14 reflector
15 color filter element
16 substrate
17 filtered light emission
18 unfiltered light emission
19 subpixel
22 subpixel
23 subpixel
31 emitting area
32 emitting area
33 emitting area
41 color filter element
42 color filter element
43 color filter element
51 emitting area
55 color filter element
56 filter opening

The invention claimed is:

1. An OLED device formed on a substrate, comprising:
   a) at least one light emitting layer arranged to produce light having a portion that is normal to the substrate in a predetermined emitting area;
   b) a reflector and a semi-transparent reflector forming a microcavity structure for resonating the light produced in the at least one light emitting layer to provide red, green or blue light normal to the substrate; and
   c) a color filter element disposed relative to a first portion of the semi-transparent reflector so as to filter the normal red, green or blue resonated light that passes through the color filtered element and the semi-transparent reflector and not covering a second portion of the semi-transparent reflector so that unfiltered normal red, green or blue normal light that passes through the second portion.

2. The OLED device of claim 1 where the reflector, the semi-transparent reflector, or both, also serve as electrodes for the light emitting layer.

3. The OLED device of claim 1 where the semi-transparent reflector is Ag or an alloy containing Ag.

4. The OLED device of claim 1 where the device is top emitting.

5. The OLED device of claim 1 where the device is bottom emitting.

6. The OLED device of claim 1 wherein the color filter element includes spaced striped filtered portions.

7. The OLED device of claim 1 wherein the color filter element includes openings in the color filter element to provide the unfiltered normal light.

* * * * *